United States Patent [19]

Kinsman

[11] 4,011,526
[45] Mar. 8, 1977

[54] TEMPERATURE COMPENSATED SURFACE ACOUSTIC WAVE OSCILLATOR

[75] Inventor: Robert Guy Kinsman, Naperville, Ill.

[73] Assignee: Motorola, Inc., Schaumburg, Ill.

[22] Filed: Jan. 5, 1976

[21] Appl. No.: 646,451

[52] U.S. Cl. .......................... 331/107 A; 331/176; 333/72; 334/5

[51] Int. Cl.² ...................... H03B 5/04; H03B 5/32; H03J 3/04

[58] Field of Search ............ 331/66, 107 A, 116 R, 331/176, 177 V; 334/5, 6; 330/143; 333/17 R, 72

[56] References Cited
UNITED STATES PATENTS

| | | | |
|---|---|---|---|
| 3,176,244 | 3/1965 | Newell et al. ................. | 331/176 X |
| 3,483,485 | 12/1969 | Scherrer ......................... | 331/176 X |
| 3,821,665 | 6/1974 | Irwin et al. ..................... | 331/116 R |
| 3,855,548 | 12/1974 | Nandi et al. .................... | 331/107 A |
| 3,868,595 | 2/1975 | Capps, Jr. et al. .......... | 331/107 A X |

Primary Examiner—Siegfried H. Grimm
Attorney, Agent, or Firm—Victor Myer; James W. Gillman

[57] ABSTRACT

Disclosed apparatus compensates for the parabolic temperature induced frequency drift characteristic of a surface acoustic wave tuned oscillator. The apparatus includes a pair of varactor diodes and a temperature sensitive voltage supply. The diodes are series connected and coupled in circuit with the oscillator to affect the frequency thereof. The voltage supply connects to the common connection of the diodes, for producing control voltages thereat.

Each varactor diode is chosen to have a $\delta > 1$; and the control voltage varies linearly with temperature. This results in a varactor diode capacitance versus temperature characteristic which is a continuous, true parabolic function providing precise compensation for the thermal drift of oscillator frequency.

7 Claims, 4 Drawing Figures

U.S. Patent                Mar. 8, 1977                4,011,526
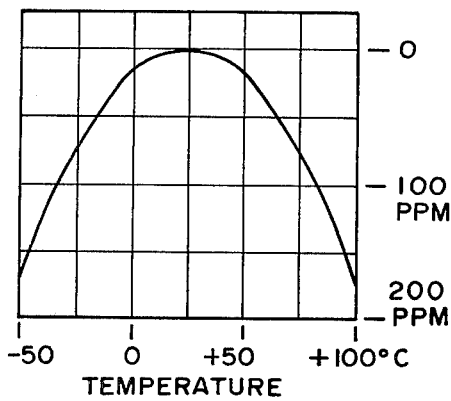
_Fig.1_
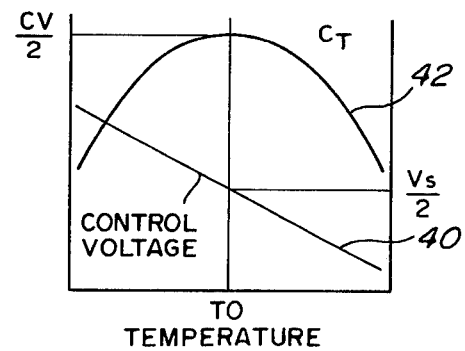
_Fig.3_
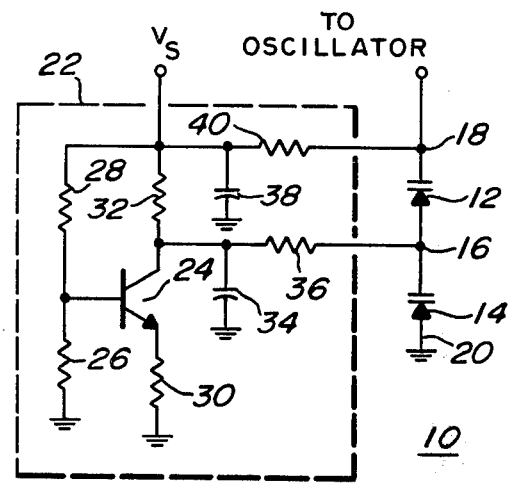
_Fig.2_
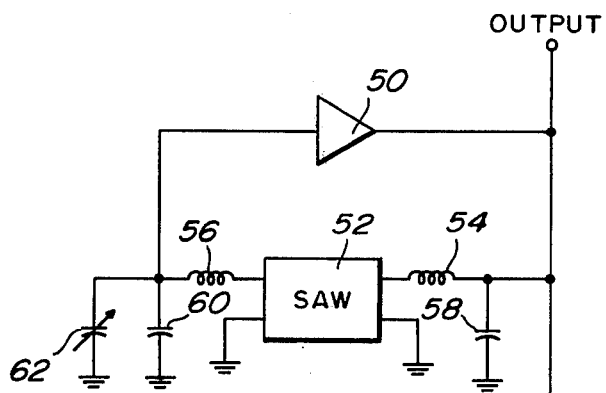
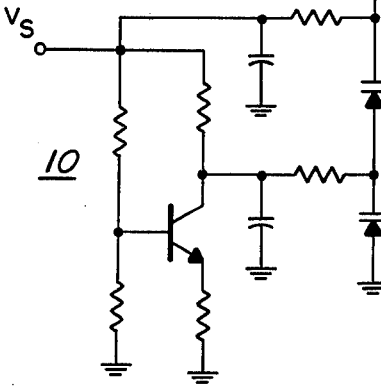
_Fig.4_

TEMPERATURE COMPENSATED SURFACE ACOUSTIC WAVE OSCILLATOR

BACKGROUND OF THE INVENTION

This invention relates to the temperature compensated tuned circuit art, and, in particular, to the temperature compensation of tuned circuits having parabolic frequency versus temperature characteristics.

Temperature compensating schemes for stabilizing the thermal drift characteristic of tunable circuits, especially oscillators, are well known in the art. A popular family of oscillators employ tuned elements having a parabolic, thermally induced frequency drift characteristic. The surface acoustic wave (SAW) device, as well as numerous crystals (e.g., the CT, DT, NT, No. 5° X, and BT types) all display this parabolic characteristic.

Prior art attempts to temperature compensate oscillator circuits of the parabolic characteristic type, have been less than satisfactory. The most commonly used compensation technique employs a complicated switching arrangement which predeterminedly switches in various control voltages across varactor diodes, which diodes are coupled in circuit with the oscillator for controlling the frequency thereof. These "piecewise" approximations to compensate for the parabolic characteristic curve are crude and do not provide a high degree of temperature stability.

OBJECTS OF THE INVENTION

It is an object of this invention, therefore, to provide a means for precisely compensating the temperature drift characteristics of tunable elements.

It is a further object of this invention to provide temperature compensation for precisely stabilizing the frequency of an oscillator which is tuned by a device displaying a parabolic frequency versus temperature characteristic.

Briefly, according to the invention, apparatus is employed for temperature stabilizing a tunable circuit which has a frequency drift characteristic parabolically related to temperature and which is adapted for tuning by a reactance connected thereto. The apparatus includes a signal variable reactance which is coupled to the tunable circuit and which has a reactance characteristic predeterminedly related to an applied control signal the signal variable reactance is comprised of two series connected varactor diodes, each of which has a $\delta > 1$. A temperature sensitive signal source applies the control signal to the variable reactance. This temperature source is predeterminedly dependent on temperature such that the reactance of the signal variable reactance varies predeterminedly in a continuous, true parabolic function of temperature. Thus, the thermally induced frequency drift of the tunable circuit is substantially compensated by the corresponding temperature dependent change developed by the apparatus.

BRIEF DESCRIPTION OF THE INVENTION

FIG. 1 illustrates the parabolic frequency versus temperature characteristic of known tuning elements;

FIG. 2 illustrates the temperature compensating apparatus according to the invention;

FIG. 3 illustrates the parabolic reactance characteristic of the preferred embodiment of the invention; and FIG. 4 illustrates a complete schematic diagram of a temperature compensated SAW controlled oscillator.

DESCRIPTION OF THE PREFERRED EMBODIMENT OF THE INVENTION

FIG. 1 illustrates the parabolic frequency versus temperature characteristic of numerous tunable frequency elements. In particular, this curve applies to a SAW device comprised of input and output transducers plated on an ST quartz substrate. The device is designed such that there is only one frequency of applied signal whereby maximum transmission and zero degree phase shift occur simultaneously. The temperature dependent frequency characteristic of the device is given by the formula:

$$f = f_0 [1 - K' (T - T_o)^2 ]$$

where:
$f$ = frequency
$f_o$ = frequency at the turnover temperature
$T$ = temperature
$T_o$ = turnover temperature
$K' = 3 \times 10^{-8}/(°C)^2$.

The frequency turnover point is a function of the crystallographic angle of the substrate and can be shifted for optimum characteristics over a particular temperature range. This temperature characteristic is typical of many of the low frequency quartz bulk wave resonators. For example, the CT, DT, NT, and BT quartz crystals all display this familiar parabolic characteristic.

To temperature compensate an oscillator employing a parabolic characteristic device requires the generation of a parabolic capacity versus temperature characteristic which has a maximum capacity at the turnover temperature of the SAW device. The varying capacitive reactance may then be coupled in configuration with the oscillator to affect the tuning thereof, thereby compensating for the drift of the parabolic characteristic tuning element.

FIG. 2 illustrates a preferred embodiment of the compensation apparatus 10 employed to generate the parabolic capacity versus temperature characteristic. The apparatus is comprised of a pair of hyperabrupt varactor diodes 12, 14 series connected to form a common point 16 and end points 18, 20 respectively.

Control of the varactor diodes 12, 14 capacitance is provided by a temperature sensitive voltage source 22. Voltage source 22 includes a transistor 24, bias resistors 26, 28, an emitter resistor 30, and a collector resistor 32. The collector of transistor 24 is coupled to the common junction 16 of the diodes 12, 14 through a shunt capacitor 34 and series resistor 36 which provide RF isolation. Similarly, the source voltage $V_s$ coupled to one end 18 of the series diodes 12, 14 via RF isolation components including capacitor 38 and resistor 40.

Operation of the compensating apparatus is best understood with reference to FIG. 3. As temperature increases, the base-emitter voltage of transistor 24 decreases in a linear fashion, roughly 2 millivolts/° C for a silicon device. This effect is amplified by the ratio of resistor 32 to resistor 30 whereby the output voltage at the collector of transistor 24 has a linear versus temperature characteristic with a negative slope, illustrated as line 40 in FIG. 3.

The effect of the linear applied voltage to the varactor diodes is understood as follows. The operation of the varactor is described by the formula:

$$C_v = C_0/(V + \Phi)^\delta$$

where:
- $C_v$ = varactor capacity
- $C_o$ = varactor capacity at 0 bias
- $V$ = applied control voltage
- $\Phi$ = junction contact potential (typically 0.7 volts for silicon devices)
- $\delta$ = capacitive exponent.

To obtain the desired parabolic capacity versus temperature characteristic the varactors must have a $\delta > 1$. For exact compensation of an ST quartz SAW device, the varactors used have a $\delta = 2$. Hyperabrupt varactor diodes having this characteristic are available from Motorola, Inc. under part No. MV 1404.

The equivalent series capacitance $C_T$ of diodes 12, 14, as a function of applied control voltage, is given by the equation:

$$C_T = \frac{0.5 C_o}{(V_o + \phi)^2 + \Delta V^2}$$

where:
- $V_o = \frac{1}{2} V_s$ (the total supply voltage), and
- $\delta = 2$ for each varactor.

When the control voltage $V$ is equal to $V_o$, the capacities of the two varactors are equal and:

$$C_T = C_t/2.$$

As the control voltage is varied in either direction, the capacity $C_T$ decreases in a symmetrical fashion, thus generating the desired parabolic characteristic. By incorporating the above formula for $C_T$ into the frequency function (i.e. tuning frequency is inversely proportional to the total capacity $C_T$ of diodes 12, 14) the frequency versus voltage relationship of the compensated oscillator is given as:

$$f_o[1 + k'' (V - V_o)^2]$$

This is plotted as graph 42 in FIG. 3, and is seen to be the mirror image of the ST quartz temperature characteristic given in FIG. 1. Thus, by proper adjustment of $k''$ and $V_o$, continuous, truly parabolic compensation can be achieved.

FIG. 4 illustrates a preferred oscillator construction employing the temperature compensation apparatus according to the invention. The oscillator is comprised of an amplifier 50, a SAW tuning device 52, impedance matching networks made up of inductors 54, 56 and capacitors 58, 60 along with trim capacitor 62. Connected in parallel with capacitor 58 is the temperature compensating circuit 10. In operation, as changing temperature induces a parabolic frequency drift of the SAW device, a corresponding parabolic change in capacitance from the temperature compensating apparatus 10 assures that the overall tuning of the oscillator remains constant.

Empirical data taken from a 150 mHz SAW controlled oscillator indicates that this compensation scheme provides a stability of ±4 ppm over a temperature range of −40° C to +70° C. The uncompensated oscillator had a total frequency drift of 110 ppm across the same range.

While a preferred embodiment of the invention has been described, it should be understood that many modifications and variations thereto are possible, all of which fall within the true spirit and scope of the invention.

For example, there are numerous ways to construct the temperature sensitive voltage source. Moreover, the compensation apparatus according to the invention is useful not only with SAW devices, but also with a family of quartz devices and, in general, with all tunable circuits having a parabolic frequency versus temperature characteristic. Further, while a preferred construction of an oscillator has been shown, it will be apparent to one skilled in the art that countless other oscillator configurations might employ the compensation apparatus according to the invention.

I claim:

1. Apparatus for temperature stabilizing a tunable circuit, said circuit having a frequency drift characteristic parabolically related to temperature, said circuit further adapted for tuning by a reactance means connected thereto, the apparatus comprising:
   a signal variable reactance means, comprised of two series connected varactor diodes, each diode having a $\delta > 1$, where $\delta$ is a factor relating varactor capacity to applied control voltage, coupled to the tunable circuit, for producing a reactance characteristic predeterminedly related to an applied control signal; and
   a temperature sensitive signal source means coupled to the signal variable reactance, for generating a control signal predeterminedly dependent on sensed temperature such that the reactance of the signal variable reactance varies predeterminedly as a continuous, true parabolic function of temperature;
   whereby temperature drift of the tunable circuit is substantially compensated by a corresponding temperature dependent change in the signal variable reactance.

2. The apparatus of claim 1 wherein the temperature sensitive signal source is comprised of a transistor stage for producing an output voltage which varies linearly with temperature.

3. The apparatus of claim 2 wherein the temperature sensitive signal source output voltage is applied at the common connection of the series connected varactor diodes.

4. Apparatus for temperature stabilizing a tunable device having a tuning frequency dependent on the capacitance applied thereto, and having a frequency drift parabolically dependent on temperature, the apparatus comprising:
   a pair of series connected varactor diodes, each diode having a $\delta > 1$, where $\delta$ is a factor relating varactor capacity to an applied bias voltage;
   means for coupling the capacitance of the series connected varactor diodes to the tunable device;
   temperature sensitive voltage supply means for generating a predetermined voltage which is linearly related to temperature; and
   means for applying the generated supply voltage to the varactor diodes,
   whereby the capacitance of the varactor diodes varies substantially parabolically with temperature to compensate for the frequency drift of the tunable device.

5. The apparatus of claim 4 wherein the temperature sensitive voltage supply means comprises a transistor stage for producing a linearly increasing output voltage with increasing transistor temperature.

6. A temperature compensated oscillator comprising:

an amplifier means having input and output terminals, and a reference terminal;

a frequency tunable device having a tuning frequency adjustable by a capacitance applied thereto and a frequency drift characteristic parabolically related to temperature;

means for coupling the frequency tunable device between the input and output terminals of the amplifier for causing the amplifier to oscillate at the frequency of the frequency tunable device;

a pair of varactor diodes, connected in series having a common terminal therebetween, each diode having a $\delta > 1$, where $\delta$ is a factor relating varactor capacitance to applied bias voltage;

means for coupling one end of the series connected diodes to the frequency tunable device and for coupling the remaining series connected diode end to said reference terminal;

temperature sensitive voltage source means for producing an output voltage linearly related to temperature; and means for connecting the output voltage of the voltage source means between said common terminal of the varactor diodes and said reference terminal, whereby the frequency drift of the oscillator due to the parabolic drift of the frequency tunable device is substantially compensated by the change in the capacitance of the series connected varactor diodes.

7. The oscillator of claim 6 wherein the frequency tunable device is comprised of a surface acoustic wave filter having an inductor of predetermined value in series therewith, and the means for coupling one end of the series connected diodes to the frequency tunable device couples to said series inductor, whereby the inductance of the inductor forms a tuned circuit with said capacitance of said series connected varactor diodes to thereby alter the tuning frequency of said frequency tunable device.

* * * * *